United States Patent
Gunamony et al.

(10) Patent No.: US 10,168,402 B2
(45) Date of Patent: Jan. 1, 2019

(54) TRANSMIT/RECEIVE SWITCH, A TRANSMIT COIL ARRAY AND A RECEIVE COIL ARRAY FOR MRI

(71) Applicant: Max-Planck-Gesellschaft zur Foerderung der Wissenschaften e. V., Munich (DE)

(72) Inventors: Shajan Gunamony, Tuebingen (DE); Jens Hoffmann, Tuebingen (DE); Klaus Scheffler, Tuebingen (DE); Rolf Pohmann, Tuebingen (DE)

(73) Assignee: Max-Planck-Gesellschaft zur Foerderung der Wissenschaften e. V., Munich (DE)

( * ) Notice: Subject to any disclaimer, the term of this patent is extended or adjusted under 35 U.S.C. 154(b) by 265 days.

(21) Appl. No.: 15/023,670

(22) PCT Filed: Sep. 25, 2013

(86) PCT No.: PCT/EP2013/002877
§ 371 (c)(1),
(2) Date: Mar. 21, 2016

(87) PCT Pub. No.: WO2015/043612
PCT Pub. Date: Apr. 2, 2015

(65) Prior Publication Data
US 2016/0209481 A1    Jul. 21, 2016

(51) Int. Cl.
*G01R 33/34* (2006.01)
*G01R 33/36* (2006.01)
(Continued)

(52) U.S. Cl.
CPC ....... *G01R 33/3614* (2013.01); *G01R 33/283* (2013.01); *G01R 33/3415* (2013.01);
(Continued)

(58) Field of Classification Search
None
See application file for complete search history.

(56) References Cited

U.S. PATENT DOCUMENTS

| | | | |
|---|---|---|---|
| 4,947,121 A | 8/1990 | Hayes | |
| 7,397,243 B1 * | 7/2008 | Bulkes | G01R 33/3614 324/307 |

(Continued)

OTHER PUBLICATIONS

Hoffmann et al., "RF Shimming Capabilities at 9.4 Tesla using a 16-channel Dual-Row Array", Proceedings of the 21st Annual Meeting of ISMRM, Salt Lake City, USA, 2013, p. 291.
Shajan et al., "A 16-channel dual-row transmit array in combination with a 31-element receive array for human brain imaging at 9.4 T", Magnetic Resonance in Medicine, vol. 71, No. 2, 2014, pp. 870-879.
Shajan et al., "A 16-Element Dual-row Transmit Coil Array for 3D RF Shimming at 9.4T",Proceedings of the 20th Annual Meeting of ISMRM, Melbourne, 2012, p. 308.

(Continued)

*Primary Examiner* — Paresh H Patel
(74) *Attorney, Agent, or Firm* — Caesar Rivise, PC

(57) ABSTRACT

The invention relates to an MRI apparatus for magnetic resonance imaging of a subject of investigation, comprising: a coil arrangement (1) for transmitting an excitation signal into the subject and for receiving a response signal from the subject; a high-power radio-frequency amplifier (4) for generating the excitation signal; and a low-noise amplifier (LNA) for amplifying the response signal. The invention provides a transmit/receive switch (5) which is alternatively operable in a transmit mode or in a receive mode. In the transmit mode, the transmit/receive switch (5) transmits the excitation signal to the coil arrangement (1) and protects the low-noise amplifier (LNA) from the outgoing excitation signal. In the receive mode, the transmit/receive switch (5) routes the in coming response signal to the low-noise amplifier (LNA).

28 Claims, 6 Drawing Sheets

(51) Int. Cl.
*G01R 33/3415* (2006.01)
*G01R 33/28* (2006.01)
*G01R 33/565* (2006.01)

(52) U.S. Cl.
CPC .... *G01R 33/3657* (2013.01); *G01R 33/34007* (2013.01); *G01R 33/5659* (2013.01)

(56) References Cited

U.S. PATENT DOCUMENTS

| | | | | |
|---|---|---|---|---|
| 2003/0210811 | A1* | 11/2003 | Dubowsky | G01R 33/28 382/128 |
| 2008/0284435 | A1* | 11/2008 | Overweg | G01R 33/341 324/318 |
| 2009/0302841 | A1* | 12/2009 | Avdievich | G01R 33/3415 324/309 |
| 2010/0275934 | A1* | 11/2010 | Keren | G01D 5/2066 128/899 |
| 2012/0223706 | A1* | 9/2012 | Hetherington | G01R 33/34007 324/307 |

OTHER PUBLICATIONS

Shajan et al., Abstract talk: "A 31-Element Receive Array for Human Brain Imaging at 9.4T", 29th Annual scientific Meeting ESMRMB 2012, Lisbon, Portugal, Magnetic Resonance Materials in Physics, Biology and Medicine, 25 (Supplement 1), 2012, p. 265-266.
Shajan et al., "Design and evaluation of an RF front-end for 9.4 T Human MRI", Magnetic Resonance in Medicine, vol. 66, No. 2, Mar. 4, 2011 (Mar. 4, 2011), pp. 594-604.
Shajan, "Trasnsceiver and Transmit-only Receive-only Arrays for Ultra-high Field MRI", ESMRMB Educational Course 2013, Berlin.
Siemens, "Magnetom Flash", Issue No. 2/2013, ISMRM 2013 Version.
International Search Report for PCT/EP2013/002877 dated Jun. 5, 2014.

* cited by examiner

TRANSMIT/RECEIVE SWITCH, A TRANSMIT COIL ARRAY AND A RECEIVE COIL ARRAY FOR MRI

FIELD OF THE INVENTION

The invention relates to a magnetic resonance imaging apparatus for magnetic resonance imaging of a subject of investigation (e.g. a patient or a test person).

STATE OF THE ART

Magnetic resonance imaging (MRI) research is increasingly moving towards 7 T and higher field strengths because of the inherent advantages of higher sensitivity, greater spectroscopic resolution and improved contrast. The design of optimized radio-frequency (RF) coils plays an important role in realizing the potential benefits offered by MRI at ultra high field (UHF) strength. The task of RF coils during the MR experiment is twofold: First, to create a magnetic field (B1+) in the imaged subject to excite the nuclear spins (transmit mode) and second, to receive the signal from the precessing magnetization (receive mode).

A number of fundamental issues complicate the design of RF coils for UHF MR systems, most significant being the shorter RF wavelength in tissue. The RF wavelength decreases with field strength and becomes as low as 14 cm and 10.5 cm at 7 T and 9.4 T, respectively, inside a human head. As the wavelength becomes comparable to or smaller than the dimension of the human head, the transmit field distribution (B1+) in the head becomes highly inhomogeneous. Typically, strong RF field in the center of the brain due to constructive interference and typical voids in the lower temporal lobes and below are seen at 7 T using volume coils driven in the standard, circularly polarized (CP) mode. The B1+ inhomogeneities are even more severe at 9.4 T than at 7 T, which makes it challenging to achieve proper spin excitation in the whole brain.

Arrays consisting of multiple, decoupled coil elements have been widely used to mitigate transmit field (B1+) inhomogeneities, since they offer the flexibility to independently influence the amplitude and phase of the current in the individual coil elements and therefore facilitate control over the B1+ field in the imaged volume. A variety of array designs has been proposed for human brain imaging at 7 T and 9.4 T, mostly consisting of a single row of elements axially distributed around the head. Arranging transmit array elements in multiple rows extends the excitation in the lower brain and provides an additional degree of freedom to correct B1+ field inhomogeneities by facilitating control over the RF field also along the superior-inferior direction.

However, most coil arrays for UHF MRI are transceiver arrays, i.e. the same array used for spin excitation and signal reception. The number of channels in most transceiver arrays presented up to now range from 8 to 16, determined by the number of available RF transmission channels in the MR scanner.

For signal reception, however, using more coil elements is beneficial: state of the art MR scanners are equipped with 32 receive channels. Covering the same brain volume with a higher number of smaller receive elements on close-fitting, shaped helmets results in significant signal to noise ratio (SNR) gain close to the array without losing sensitivity at larger distances and improves parallel imaging performance due to the larger number of independent receive elements that are distributed in all spatial directions. The latter is an important factor in realizing the advantages of ultra high field MRI, since the reduced wavelength at high resonance frequency results in more distinct coil sensitivities and hence more effective sensitivity encoding.

In conventional transceive arrangements, the excitation signal is generated by a high-power RF amplifier, while the response signal received from the subject under investigation is amplified by a low-noise amplifier. The transmit and receive functions are separated by appropriately biasing the PIN diodes of a TR switch. Furthermore, it is also essential to protect the low-noise amplifier from the outgoing high-power excitation signal.

SUMMARY OF THE INVENTION

Therefore, it is an object of the invention to provide protection for the low-noise amplifier.

This object is achieved by a magnetic resonance imaging apparatus according to the invention.

The invention provides a magnetic resonance imaging apparatus for magnetic resonance imaging of a subject of investigation (e.g. a patient, a test person).

The magnetic resonance imaging apparatus according to the invention comprises a coil arrangement for transmitting an excitation signal into the subject thereby exciting nuclear spins within the subject and/or for receiving a response signal emitted by the excited spins from the subject.

Further, the magnetic resonance imaging apparatus according to the invention comprises a high-power radio-frequency amplifier for generating the excitation signal to be transmitted into the subject at the Larmor frequency.

Moreover, the magnetic resonance imaging apparatus according to the invention comprises a low-noise amplifier for receiving and amplifying the response signal from the subject.

Additionally, the magnetic resonance imaging apparatus according to the invention comprises a transmit/receive switch arranged between the coil arrangement on the one hand and the low-noise amplifier and the high-power radio-frequency amplifier on the other hand, wherein the transmit/receive switch is alternatively operable in a transmit mode or in a receive mode.

In the transmit mode, the transmit/receive switch transmits the excitation signal from the high-power radio-frequency amplifier to the coil arrangement, while the transmit/receive switch protects the low-noise amplifier from the outgoing excitation signal.

In the receive mode, the transmit/receive switch routes the incoming response signal to the low-noise amplifier.

The transmit/receive switch comprises a receive path between the coil arrangement and the low-noise amplifier. A quarter-wavelength segment is preferably arranged in the receive path of the transmit/receive switch, wherein the quarter-wavelength segment corresponds to a quarter-wavelength of the Larmor frequency. Further, a diode is preferably arranged at one end of the quarter-wavelength segment to short-circuit the receive path at said end of the quarter-wavelength segment, thereby creating an open circuit at the other end of the quarter-wavelength segment and thus preventing the outgoing excitation signal from reaching the low-noise amplifier.

The diode used to short-circuit the receive path is preferably a PIN diode (PIN: positive intrinsic negative). However, other types of diodes can be used, as well.

Further, the quarter-wavelength segment preferably comprises a coaxial cable or a lumped network.

In the preferred embodiment of the invention, the lumped network forming the quarter-wavelength segment comprises an inductance arranged along the receive path, a first capacitor connected between a first end of the inductance and ground, and a second capacitor connected between a second end of the inductance and ground.

In one embodiment of the invention, an additional phase shift element (e.g. a coaxial cable or a lumped network) is arranged in the receive path of the transmit/receive switch, wherein the phase shift element adjusts the phase length of the receive path of the transmit/receive switch, so that a low impedance of the low-noise amplifier is transformed into a high impedance thereby creating additional protection for the low-noise amplifier.

Further, it should be noted that the coil arrangement preferably comprises both a transmit coil arrangement and a receive coil arrangement so that it constitutes a transceiver coil arrangement. If the same coil is used for both transmit and receive, it is called a transceiver coil. If two separate coils are used, then it is transmit-only receive-only coil arrangement.

The transmit coil arrangement is preferably ring-shaped (e.g. cylindrical) and surrounds the subject of investigation. Further, the transmit coil arrangement preferably comprises several coil elements. Moreover, the coil elements of the transmit coil arrangement are preferably symmetrically distributed around the circumference of the transmit coil arrangement.

In the preferred embodiment of the transmit coil arrangement, the coil elements of the transmit coil arrangement are arranged in several adjacent and parallel rows, wherein the rows are arranged one behind the other along a centre axis of the transmit coil arrangement. Further, there is preferably a gap in an axial direction between the adjacent rows of the transmit coil arrangement. Moreover, there is preferably a gap in a circumferential direction between the adjacent coil elements in each row of the transmit coil arrangement.

The gaps in the transmit coil arrangement are preferably between 10 mm and 14 mm, particularly 12 mm, and the number of the coil elements of the transmit coil arrangement is preferably at least 8 or 16. Further, the number of the rows of the transmit coil arrangement is preferably at least two. For example, there can be two rows each having eight coil elements.

In the preferred embodiment of the transmit coil arrangement, there is an angular offset in a circumferential direction between the coil elements in one of the rows relative to the coil elements in an adjacent one of the rows of the transmit coil arrangement. The angular offset between the adjacent rows of the transmit coil arrangement is 180° divided by the number of the coil elements in the individual rows. For example the angular offset if preferably 22.5° if there are two rows each having eight coil elements.

Further, the receive coil arrangement is preferably concave to match an outer convex contour of the subject. For example, the receive coil arrangement can be helmet-shaped to match the outer contour of a head of human being. Alternatively, the receive coil arrangement can be hemispherical.

Moreover, the receive coil arrangement preferably comprises several coil elements. Moreover, the coil elements of the receive coil arrangement are preferably symmetrically distributed around the circumference of the receive coil arrangement.

Further, it should be noted that the coil elements of the receive coil arrangement are preferably arranged in several adjacent and parallel rows which are arranged one behind the other along a centre axis of the receive coil arrangement. Further, there is preferably an axial overlap between the adjacent rows, so that the coil elements in one of the rows of the receive coil arrangement and the coil elements in an adjacent one of the rows of the receive coil arrangement geometrically overlap. Moreover, there is preferably a gap in a circumferential direction between the adjacent coil elements in the same row of the receive coil arrangement.

The receive coil arrangement preferably comprises an angular offset in a circumferential direction between the coil elements in one of the rows relative to the coil elements in an adjacent one of the rows of the receive coil arrangement. Further, the angular offset is provided in such a way that each lower row element symmetrically overlaps with two elements of the upper row. Further, the angular offset between the adjacent rows of the receive coil arrangement rows is preferably 180° divided by the number of the coil elements in the individual rows.

In case of a helmet-shaped receive coil arrangement and for rows with coil elements only partially covering the circumference of the coil arrangement, the angular offset in the receive array will not meet this criteria because the helmet is not a perfect cylinder. The criteria for angular offset is that each lower row element symmetrically overlaps with two elements of the upper row.

Further, the rows of the receive coil arrangement are preferably arranged one above the other with regard to the centre axis of the receive coil arrangement. Moreover, the individual coil elements of the lower rows of the receive coil arrangement each geometrically overlap with two coil elements of the adjacent upper row of the receive coil arrangement.

The gaps in the receive coil arrangement are preferably between 8 mm and 12 mm, particularly 10 mm. Further, the number of the coil elements of the receive coil arrangement is preferably at least 31. Moreover, the number of the rows of the receive coil arrangement is preferably at least four, while the number of the coil elements of the receive coil arrangement is preferably greater than the number of the coil elements of the transmit coil arrangement. Moreover, the receive coil arrangement preferably extends over a length of at least 180 mm along the centre axis of the receive coil arrangement. It should also be noted that the individual coil elements of the receive coil arrangement are preferably smaller than the individual coil elements of the transmit coil arrangement.

In the case of a concave (e.g. helmet-shaped) receive coil arrangement, the individual coil elements in the top row of the concave receive coil arrangement preferably taper upwards so that the tapered upper coil elements cover the helmet's dome.

It should further be noted that the individual neighbouring coil elements of the transmit coil arrangement are inductively decoupled from each other. Not all neighboring elements of the receive coil are inductively decoupled. The adjacent elements within the same row are inductively decoupled whereas the neighboring elements from different rows are decoupled by geometric overlap.

Further, the individual coil elements of the transmit coil arrangement are preferably rectangular loops, while the individual coil elements of the receive coil arrangement are preferably rectangular loops or trapezoid loops.

In the preferred embodiment of the invention, the receive coil arrangement is arranged within the transmit coil arrangement, so that the receive coil arrangement is closer to the subject than the transmit coil arrangement. Further, the ring-shaped transmit coil arrangement preferably has a larger diameter than the ring-shaped receive coil arrangement, and the individual coil elements of the receive coil arrangement are preferably smaller than the individual coil elements of the transmit coil arrangement. This improves the reception quality of the receive coil arrangement.

In one embodiment of the invention, the receive coil arrangement and the transmit coil arrangement are aligned coaxially relative to each other.

In another embodiment of the invention, the receive coil arrangement and the transmit coil arrangement are aligned merely parallel to each other, wherein the receive coil arrangement is located within the transmit coil arrangement. In this embodiment of the invention, the receive coil arrangement is excentrically offset to one side relative to the surrounding transmit coil arrangement thereby leaving installation space within the transmit coil arrangement on the opposite side. Further, the receive coil arrangement preferably comprises an interruption in its circumference, wherein the interruption provides the afore-mentioned installation space.

The afore-mentioned installation space can accommodate an optics (e.g. a periscope), wherein the optics allows a visual stimulation of a human being within the magnetic resonance imaging apparatus.

It should further be noted that the receive coil arrangement and/or the transmit coil arrangement preferably comprises a carrier on which the individual coil elements are mounted, wherein the carrier is preferably made of fibre glass.

Finally, it should be noted that the frequency of the excitation signal is preferably high enough to excite the spins of the hydrogen nucleus nuclear spins within the subject when the subject is exposed to a magnetic-field strength of at least 7 T.

Scientific Background

The invention provides the first setup that combines the benefits offered by parallel transmission and reception techniques using individual arrays for field strength as high as 9.4 T.

For spin excitation, a 16-channel dual-row transmit array was constructed. The relatively large diameter of this array provides a safe distance between the transmitting elements and the human subject and decreases the sensitivity of coupling and reflected power to varying loads. This obviates the necessity of readjusting the array to different subjects. A novel geometrical arrangement of the transmit elements is introduced that simplifies decoupling to adjacent elements.

Furthermore, the transmit array has built-in Transmit/receive switches, which allows the array to be used in transmit-only mode or in transceive mode. The transmit/receive switches are realized using a novel method for 2nd stage preamplifier protection.

To further increase the receive performance, a receive array with 31-receive elements was constructed on a tight-fitting helmet-shaped former. As in the transmit array, the receive array design consists of a novel coil arrangement which simplifies the decoupling of adjacent coil elements and improves parallel imaging performance.

The combination of the two coil arrays provides two significant benefits: 1. A dual-row transmit array to control the transmit B1+ field in all three spatial directions. 2. A tight fitting receive array with increased receive sensitivity and improved parallel imaging capability.

The entire work can be sub-divided into 3 sub-systems:
1. transmit/receive switch design
2. 16-channel dual-row transceiver array
3. 31-channel receive array.

A transmit/receive switch is an essential component if the same MRI RF coil is used for spin excitation and signal reception. There are two modes of operation in a transmit/receive switch. During transmit mode, the high power RF signal from the RF amplifier is transmitted to the coil with minimum loss, while protecting the preamplifier from high power RF. In the receive mode, the received signal is routed to the receive preamplifier, while preventing the transmit port noise from coupling to the preamplifier. The functioning of the transmit/receive switch is accomplished by PIN diode circuits.

Typically, the preamplifiers are protected from the high power RF by using quarter-wave segments, realized using coaxial cables or by lumped components, in combination with a PIN diode. The PIN diode is used to create short-circuit at one end of the quarter-wave line. This creates an open circuit at the other end of the 90 degree section and prevents the high power RF signal from entering the receive side. The amount of protection needed depends on the peak RF power. If additional protection is needed, a second quarter wave section along with a PIN diode is added before the preamplifier. In our approach, the additional protection function was achieved by using the low input impedance of an MRI preamplifier thereby reducing the insertion loss by avoiding a second PIN diode section. The schematic of a transmit/receive switch is shown in FIG. 1. In this circuit, the diode D1 together with the 90° pi network forms the receiver protection circuit.

In receive array MRI coils, the mutual inductive coupling between non-neighboring coil-elements is reduced by using preamplifiers with low input impedance. Hence, most MRI preamplifiers are designed to have low input impedance. In the transmit/receive switch schematic shown in FIG. 1, a low input impedance preamplifier is used. By adjusting the phase length of the receive path, the low input impedance of the preamplifier is transformed to a high impedance, thereby creating additional protection for the preamplifier. The equivalent circuit of the phase-length optimized transmit/receive switch is shown in FIG. 2.

FIGS. 3A and 3B shows the preamplifier output level in the receive mode and transmit mode respectively. The difference between the two levels (54.95 dB) shows the amount of receiver protection achieved with this novel design.

The transmit coil was constructed on a fiber glass with an inner diameter of 28 cm. It consists of 16 identical rectangular loops (85 mm×100 mm) arranged in two rows of eight elements each. Mutual decoupling of all transmit elements gets more intricate using multi-row designs, since the number of adjacent, coupled elements increases.

To overcome this, a novel coil element layout was adopted. 1. A 12 mm gap was provided between the elements of the same row and between the rows. 2. Lower row elements were rotated 22.5° with respect to the upper row. 3. All adjacent elements were inductively decoupled.

Such a novel coil arrangement provides the following benefits:
1. Each coil element has only four elements in close proximity (two adjacent elements of the same row and two adjacent elements of the next row) instead of five (if the second row would not be rotated).
2. Each neighboring element has a wire segment running parallel to the original element. This facilitates straightforward implementation of decoupling inductors between the elements for decoupling.
3. The geometric separation of the non-neighboring coil elements is large enough to minimize the coupling between these elements.

4. Reduced coupling between the coil elements results in distinct field profiles of individual coil elements which is suited for RF shimming applications.

To enable coil operation in transceive mode, miniaturized transmit/receive switches with preamplifiers were included inside the coil housing. Even though this coil was not optimized for receive performance, adding receive capability provided two main benefits: First, it can be combined with non-proton coils where proton images are needed for localization, though additional cable traps might be required at the non-proton frequency. Second, the external transmit/receive switch modules that are used in most transceiver arrays are removed, which simplifies the setup and reduces the loss in the receive path.

To increase the receive sensitivity, the 16-channel dual row transmit array was combined with a 31-channel receive array. Covering the same brain volume with a higher number of smaller receive elements arranged on coil formers that closely follows the contours of the anatomy results in significant signal to noise ratio gain. A total of 31 receive elements were arranged on a helmet in four rows covering a length of 180 mm along the z-direction. In each of the first two rows, ten elements formed two complete rings around the helmet. The 3rd and 4th row consisted of symmetrically arranged partial rings with seven and four elements respectively.

A combination of inductive decoupling and geometric overlap was adopted to cancel the inductive coupling between neighboring coil elements. 10 mm gap (8 mm for row 1) was maintained between the adjacent elements in the same row and the coupling between these elements was minimized by inductive decoupling. The novel layout arrangement leads to smaller element size and larger separation between the non-neighboring coil elements. The larger geometric separation between the coil elements leads to reduced coupling between non adjacent coil elements. Each lower row element geometrically overlaps with two from the upper row. The elements in the 1st row were tapered to cover the helmet's dome. Since adding an additional element to the 3rd or 4th row would spoil the left-right symmetry, the 32nd receive channel was not used.

DETAILED DESCRIPTION OF THE DRAWINGS

Figure 1:
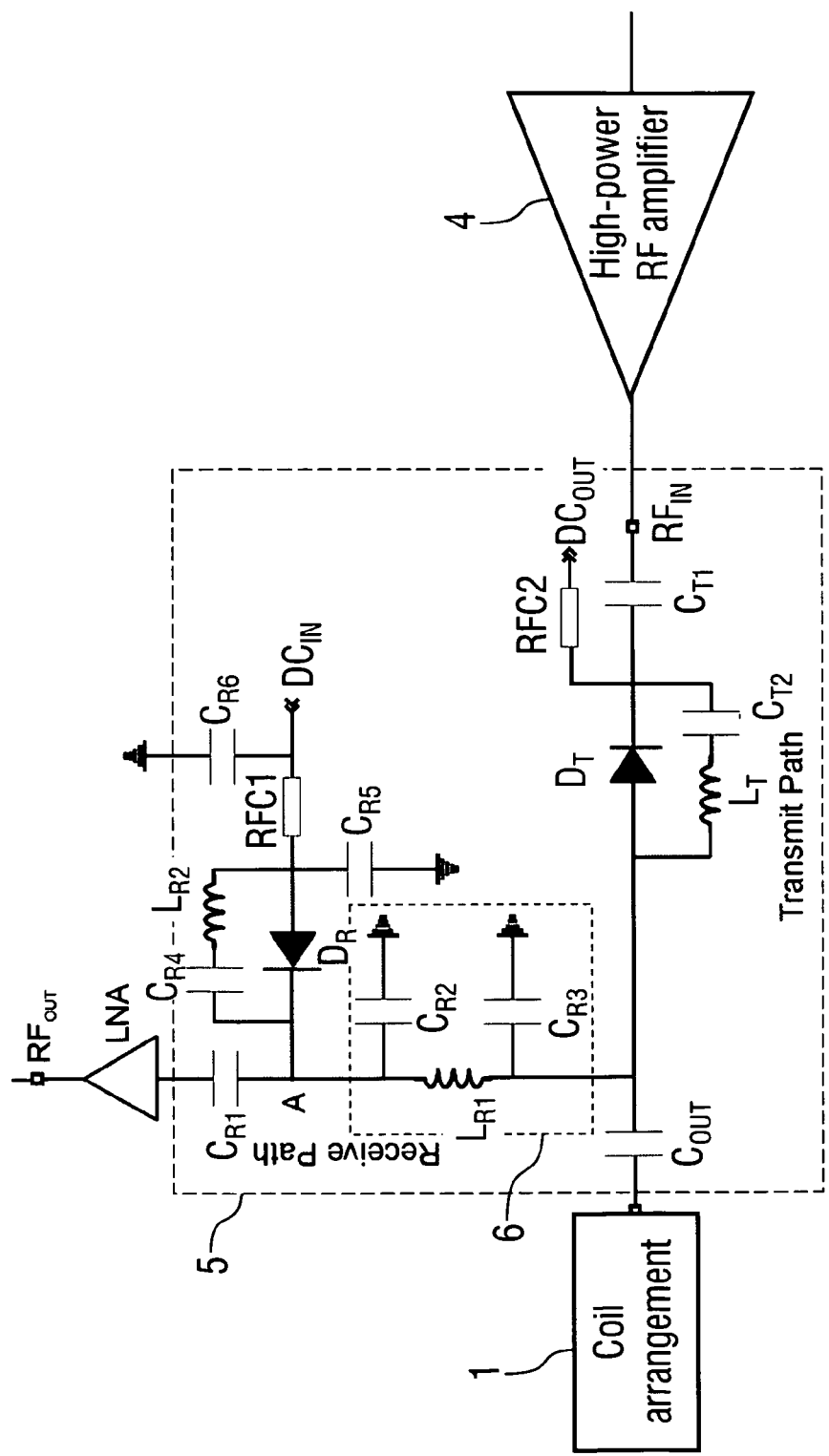
FIG. 1 shows a schematic block diagram of a first embodiment of a magnetic resonance imaging apparatus according to the invention.

FIG. 1 illustrates a first embodiment of a magnetic resonance imaging apparatus according to the invention.

Figure 4:
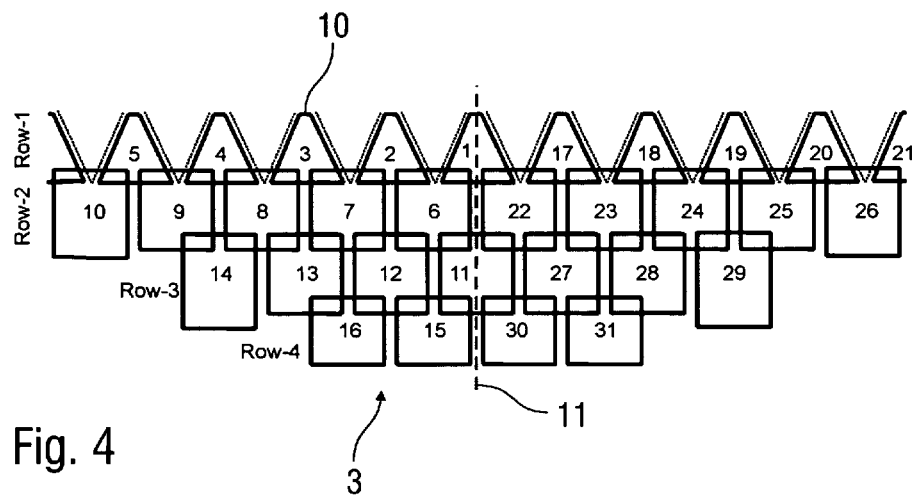
FIG. 4 shows a schematic representation of the receive coil arrangement.
Figure 6:
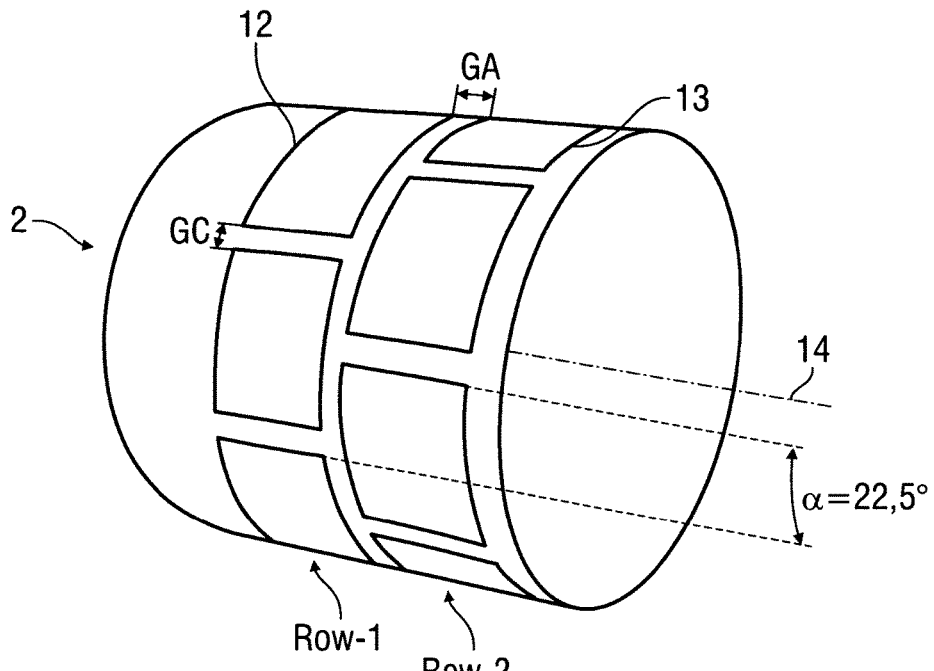
FIG. 6 shows a perspective view of a preferred embodiment of the transmit coil arrangement.
Figure 7:
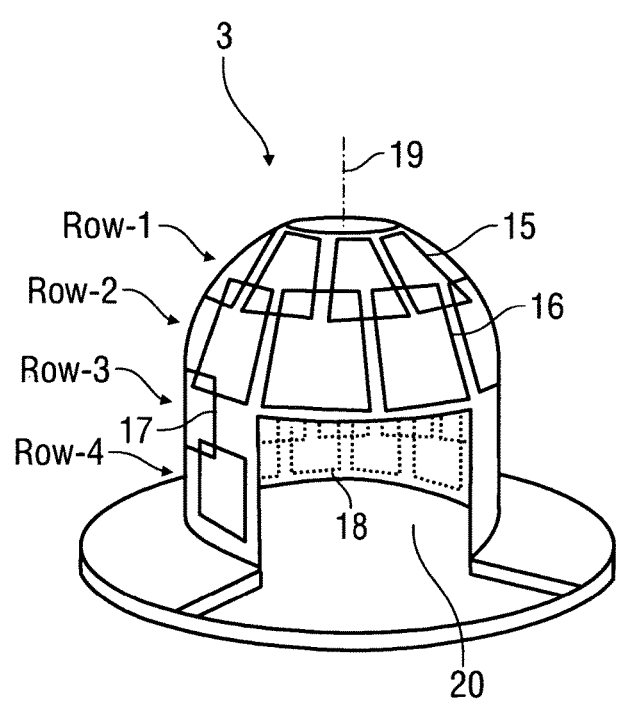
FIG. 7 shows a perspective view of a preferred embodiment of the receive coil arrangement.

The magnetic resonance imaging apparatus comprises a coil arrangement 1 comprising both a transmit coil arrangement 2 and a receive coil arrangement 3, wherein the transmit coil arrangement 2 is shown in FIG. 6, while the receive coil arrangement 3 is shown in FIGS. 4 and 7. The transmit coil arrangement 2 serves for transmitting an excitation signal into the subject of investigation (e.g. a patient or a test person) thereby exciting nuclear spins within the subject, while the receive coil arrangement 3 serves for receiving a response signal emitted by the excited spins within the subject of investigation.

Further, the magnetic resonance imaging apparatus comprises a high-power radio-frequency amplifier 4 for generating the excitation signal to be transmitted into the subject at the Larmor frequency.

Moreover, the magnetic resonance imaging apparatus comprises a low-noise amplifier LNA for receiving and amplifying the response signal from the subject under investigation.

Further, a transmit/receive switch 5 is arranged between the coil arrangement 1 on the one hand and the low-noise amplifier LNA and the high-power radio-frequency amplifier 4 on the other hand. The transmit/receive switch 5 is alternatively operable in a transmit mode or in a receive mode.

In the transmit mode, the transmit/receive switch 5 transmits the excitation signal from the high-power radio-frequency amplifier 4 via a transmit path to the coil arrangement 1, while the transmit/receive switch 5 protects the low-noise amplifier LNA from the outgoing excitation signal.

In the receive mode, the transmit/receive switch 5 routes the incoming response signal from the coil arrangement 1 via a receive path to the low-noise amplifier LNA.

The switching between the transmit mode and the receive mode is controlled by a control signal $DC_{IN}$ which is provided by a scanner of the magnetic resonance imaging apparatus.

A quarter-wavelength segment 6 is arranged in the receive path of the transmit/receive switch 5, wherein the quarter-wavelength segment 6 corresponds to a quarter-wavelength of the Larmor frequency.

At one end A of the quarter-wavelength segment 6, a PIN diode $D_R$ is connected in series with a RF choke RFC1, wherein the control signal $DC_{IN}$ is applied to the other end of the RF choke RFC1. Further, both ends of the RF choke RFC1 are connected to ground via capacitors $C_{R5}$, $C_{R6}$. $C_{R6}$ is a RF bypass capacitor to ground the high frequency components in the incoming DC signal. Moreover, a series connection of capacitor $C_{R4}$ and an inductance $L_{R2}$ is connected across the PIN diode $D_R$.

Further, the end A of the quarter-wavelength segment 6 is connected via a DC blocking capacitor $C_{R1}$ to the input of the low-noise amplifier LNA.

The quarter-wavelength segment 6 consists of an inductance $L_{R1}$ arranged in series in the receive path and two capacitors $C_{R2}$, $C_{R3}$ connecting both sides of the inductance $L_{R1}$ to ground.

The PIN diode $D_R$ is turned on during transmit-mode and using $C_{R5}$ a low impedance at the Larmor frequency is created at the end A of the quarter wavelength segment 6. This creates an open circuit at the other end of the quarter-wavelength segment 6 and prevents the high-power radio-frequency signal generated by the high-power radio-frequency amplifier 4 from entering the low-noise amplifier LNA. The amount of protection needed depends on the peak radio-frequency power.

If additional protection is needed, another quarter-wavelength segment can be arranged in the receive path along with another PIN diode.

Further, the transmit/receive switch 5 comprises a transmit path connecting the high-power radio-frequency amplifier 4 with the coil arrangement 1.

On the input side of the transmit path of the transmit/receive switch 5, a network is arranged comprising a diode $D_T$ and a capacitor $C_{T1}$ connected in series. Further, a series connection of an inductance $L_T$ and a capacitor $C_{T2}$ is connected across the diode $D_T$. Finally, a RF choke RFC2 is connected to the connection point between the diode $D_T$ and the capacitor $C_{T1}$. The series connection of the inductance $L_T$ and the capacitor $C_{T2}$ resonates across the parallel capacitance of the PIN diode in the reverse bias condition. The values of the inductance $L_T$ and the capacitor $C_{T2}$ are chosen to maximize the isolation across the diode terminals. Therefore, the network in the transmit path prevents the incoming response signal from the coil arrangement 1 from reaching the high-power radio-frequency amplifier 4 via the transmit path.

Finally, the transmit/receive switch 5 comprises a capacitor $C_{OUT}$ at its output terminal connecting the coil arrangement 1.

Figure 2:
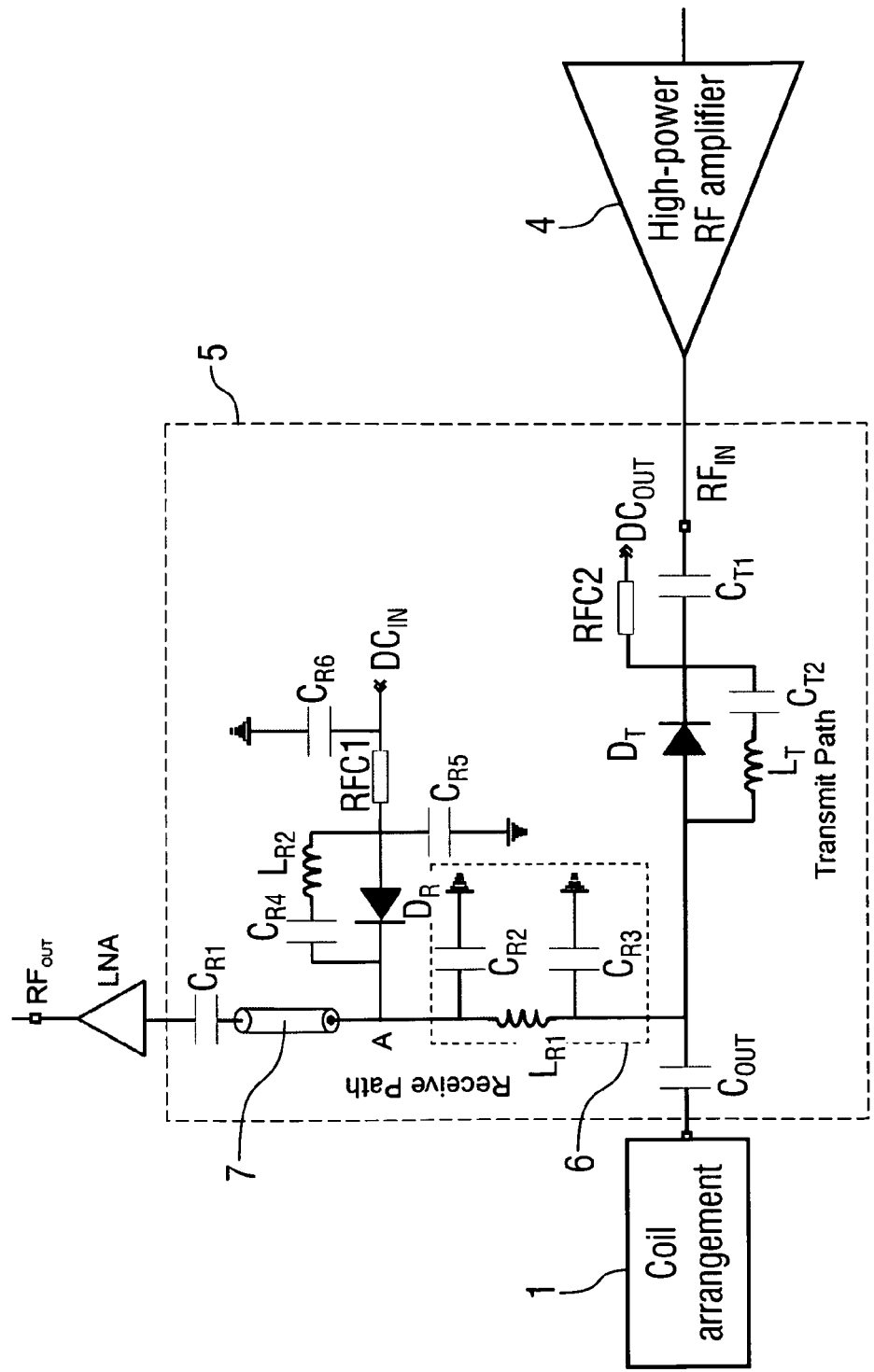
FIG. 2 shows a schematic block diagram of a second embodiment of a magnetic resonance imaging apparatus according to the invention.

FIG. 2 shows a modification of the embodiment according to FIG. 1 so that reference is made to the above description with regard to FIG. 1. Further, the same reference signs are used for corresponding parts and details.

In this embodiment, the transmit/receive switch 5 additionally comprises a phase shift element 7 in the form of a coaxial cable, wherein the phase shift element 7 is arranged in the receive path of the transmit/receive switch 5 between the quarter-wavelength segment 6 and the capacitor $C_{R1}$. The phase shift element 7 adjusts the phase length of the receive path of the transmit/receive switch 5, so that a low impedance of the low-noise amplifier LNA is transformed into a high impedance thereby creating additional protection for the low-noise amplifier LNA.

Figure 3A:
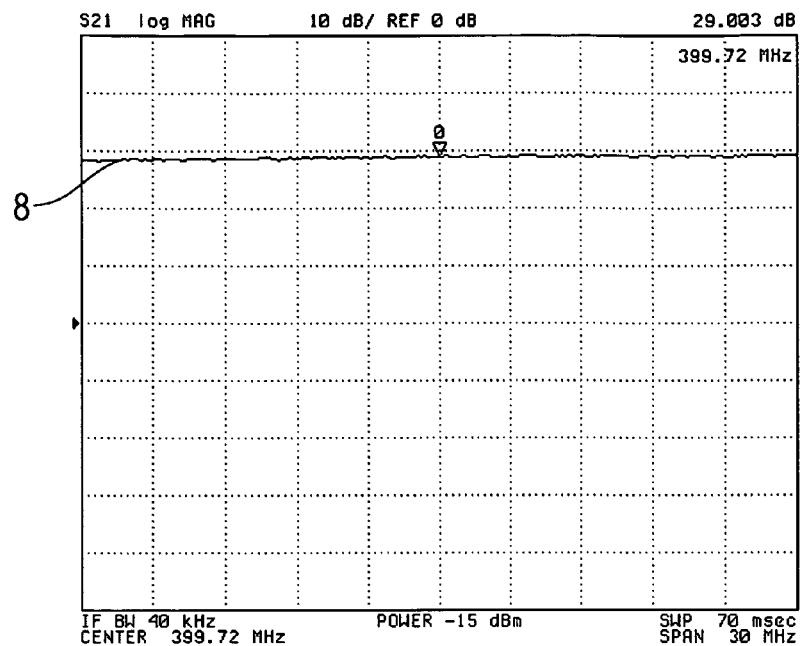
FIG. 3A shows the output signal of the low-noise amplifier in the receive mode.
Figure 3B:
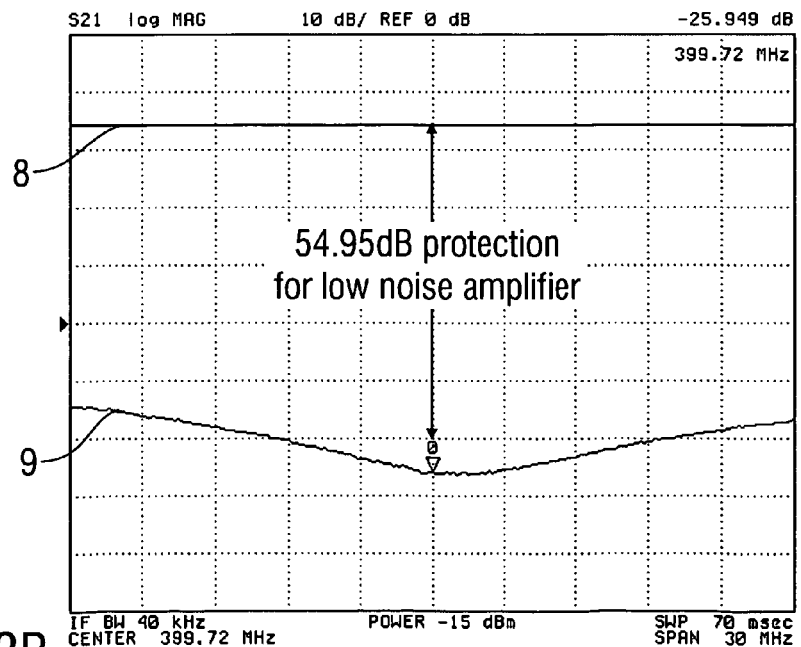
FIG. 3B shows the output signal of the low-noise amplifier in the transmit mode with a substantial attenuation providing protection for the low-noise amplifier.

FIG. 3A shows the output 8 of the low-noise amplifier LNA in the receive mode, while FIG. 3B also shows the output 9 of the low-noise amplifier LNA in the transmit mode. FIG. 3B clearly shows that there is an attenuation of 54.95 dB between both signals 8, 9 providing protection for the low-noise amplifier LNA.

FIG. 4 shows a schematic diagram illustrating the receive coil arrangement 3. The diagram shows that the receive coil arrangement 3 comprises four parallel rows Row-1, Row-2, Row-3, Row-4 one above the other.

Further, the diagram shows that each of the rows Row-1, Row-2, Row-3, Row-4 of the receive coil arrangement 3 comprises several coil elements 10, wherein the coil elements 10 in the upper row Row-1 are trapezoid, while the coil elements 10 in the lower rows Row-2, Row-3, Row-4 are rectangular.

Moreover, the diagram shows that the rows Row-1, Row-2, Row-3, Row-4 are overlapping, wherein each coil element 10 of the lower rows Row-2, Row-3, Row-4 overlaps with two coil elements 10 of the adjacent upper row. Finally, the diagram shows that the receive coil arrangement 3 is symmetrical around its circumference with regard to an axis of symmetry 11.

Figure 5:
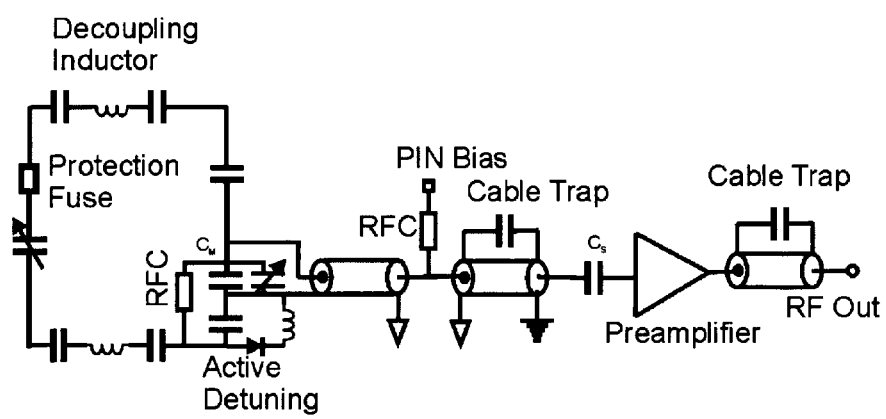
FIG. 5 shows an equivalent circuit of a single receive coil.

FIG. 5 shows an equivalent circuit of a single receive coil, wherein the diagram is self-explanatory.

FIG. 6 shows a perspective view of the transmit coil arrangement 2, which comprises two rows Row-1, Row-2 of coil elements 12, 13, wherein the rows Row-1, Row-2 are arranged parallel to each other one above the other along a centre axis 14 of the transmit coil arrangement 2.

Further, it should be noted that the coil elements 12, 13 of the transmit coil arrangement 2 are symmetrically distributed around the circumference of the transmit coil arrangement 2.

Moreover, there is an axial gap GA between the adjacent rows Row-1, Row-2.

Further, there is a gap GC between the adjacent coil elements 12, 13 in a circumferential direction.

Finally, the drawing shows an angular offset $\alpha=22.5°$ between the coil elements 12 in the first row Row-1 and the coil element 13 in the second row Row-2 of the transmit coil arrangement 2.

FIG. 7 shows a perspective view of the receive coil arrangement 3.

The drawing shows that the receive coil arrangement 3 comprises four rows Row-1, Row-2, Row-3, Row-4 of coil elements 15 18. The rows Row-1, Row-2, Row-3, Row-4 are arranged parallel to each other one above the other along a centre axis 19 of the receive coil arrangement 3.

Further, the drawing shows that the receive coil arrangement 3 comprises an interruption 20 in the lower rows Row-3, Row-4. In other words, the lower rows Row-3, Row-4 do not extend over the entire circumference of the receive coil arrangement 3. This is to ensure an open face design.

Figure 8:
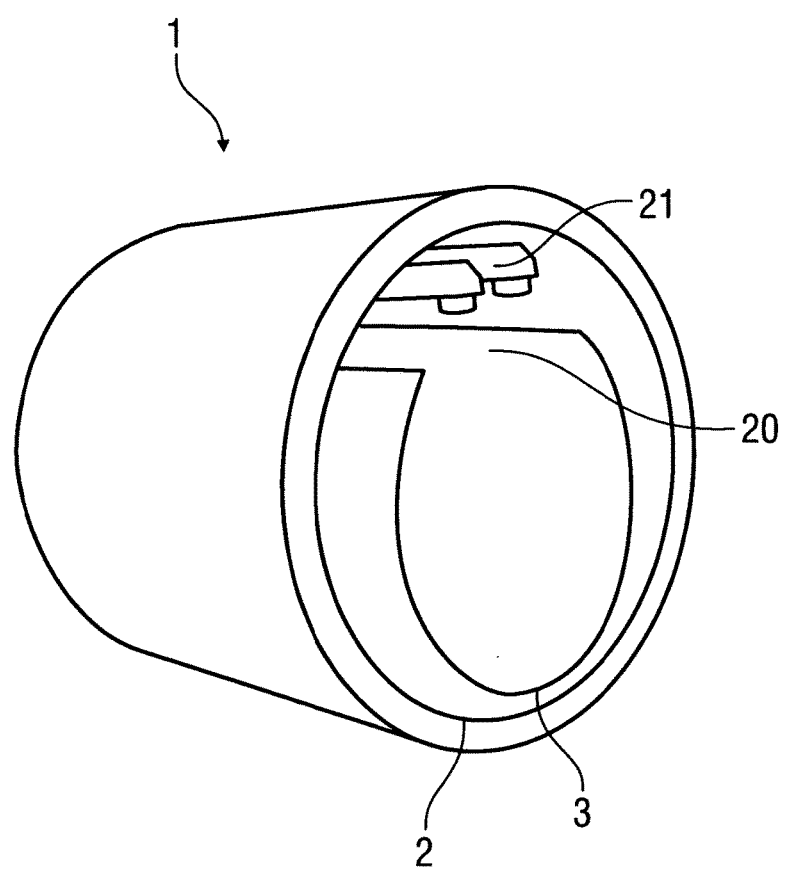
FIG. 8 shows a perspective view of a preferred embodiment of en entire coil arrangement comprising both the transmit coil arrangement and the receive coil arrangement

Finally, FIG. 8 shows a perspective view of the entire coil arrangement 1 comprising both the transmit coil arrangement 2 and the receive coil arrangement 3.

The drawing shows that the receive coil arrangement 3 is arranged within the transmit coil arrangement 2, so that the receive coil arrangement 3 is closer to the subject of investigation resulting in better receiving quality.

Further, the drawing shows that a fibre optics periscope 21 is arranged in an installation space provided by the interruption 20 in the receive coil arrangement 3. The fibre optics periscope 21 can be used for visual stimulation of the subject of investigation during magnetic resonance imaging.

Although the invention has been described with reference to the particular arrangement of parts, features and the like, these are not intended to exhaust all possible arrangement of features, and indeed many other modifications and variations will be ascertainable to those of skill in the art. Particularly, the invention also claims protection for the novel design of the transmit coil arrangement and the receive coil arrangement independently from the transmit/receive switch.

LIST OF REFERENCE SIGNS

1 Coil arrangement
2 Transmit coil arrangement
3 Receive coil arrangement
4 High-power radio-frequency amplifier
5 Transmit/receive switch
6 Quarter-wavelength segment in the receive path
7 Phase shift element in the receive path
8 Output of the low-noise amplifier in the receive mode
9 Output of the low-noise amplifier in the transmit mode
10 Coil elements of the receive coil arrangement
11 Axis of symmetry of the receive coil arrangement
12 Coil elements of the transmit coil arrangement
13 Coil elements of the transmit coil arrangement
14 Centre axis of the transmit coil arrangement
15 Coil elements of the receive coil arrangement
16 Coil elements of the receive coil arrangement 17 Coil elements of the receive coil arrangement
18 Coil elements of the receive coil arrangement
19 Centre axis of the receive coil arrangement
20 Interruption in the circumference of the receive coil arrangement
21 Fiber optics periscope
A End of the quarter wavelength segment
$C_{OUT}$ Capacitor
$C_{R1}$ Capacitor in the receive path
$C_{R2}$ Capacitor in the receive path
$C_{R3}$ Capacitor in the receive path
$C_{R4}$ Capacitor in the receive path
$C_{R5}$ Capacitor in the receive path
$C_{R6}$ Capacitor in the receive path
$C_{T1}$ Capacitor in the transmit path
$C_{T2}$ Capacitor in the transmit path
$DC_{IN}$ Control signal for switching the transmit/receive switch between transmit mode and receive mode
$D_R$ PIN diode in the receive path
$D_T$ Diode in the transmit path
GA Axial gap between the rows of the transmit coil arrangement
GC Circumferential gap between the adjacent coil elements of the transmit coil arrangement
LNA Low-noise amplifier
$L_{R1}$ Inductance in the receive path
$L_{R2}$ Inductance in the receive path
RFC1 RF choke in the receive path
RFC2 RF choke in the transmit path

The invention claimed is:

1. A magnetic resonance imaging apparatus for magnetic resonance imaging of a subject of investigation, comprising:
   a) a coil arrangement for at least one of
      a1) transmitting an excitation signal into the subject thereby exciting nuclear spins within the subject and
      a2) receiving a response signal emitted by excited spins from the subject,
   b) a high-power radio-frequency amplifier for generating the excitation signal to be transmitted into the subject,
   c) a low-noise amplifier for receiving and amplifying the response signal from the subject,
   d) a transmit/receive switch arranged between the coil arrangement on the one hand and the low-noise amplifier and the high-power radio-frequency amplifier on the other hand, the transmit/receive switch having a receive path between the coil arrangement and the low-noise amplifier, wherein the transmit/receive switch is alternatively operable in
      d1) a transmit mode, in which the transmit/receive switch transmits the excitation signal from the high-power radio-frequency amplifier to the coil arrangement, while the transmit/receive switch protects the low-noise amplifier from an outgoing excitation signal, and
      d2) a receive mode, in which the transmit/receive switch routes an incoming response signal to the low-noise amplifier
   e) a quarter-wavelength segment arranged in the receive path of the transmit/receive switch, wherein the quarter-wavelength segment corresponds to a quarter wavelength of the Larmor frequency, and
   f) a diode arranged at one end of the quarter-wavelength segment to short-circuit the receive path at said end of the quarter-wavelength segment, thereby creating an open circuit at the other end of the quarter-wavelength segment and thus preventing the outgoing excitation signal from reaching the low-noise amplifier.

2. The magnetic resonance imaging apparatus according to claim wherein the quarter-wavelength segment comprises a coaxial cable or a lumped network.

3. The magnetic resonance imaging apparatus according to claim 2, wherein the lumped network in the receive path of the transmit/receive switch comprises the following components:
   a) an inductance arranged along the receive path,
   b) a first capacitor connected between the first end of the inductance and ground, and
   c) a second capacitor connected between a second end of the inductance and ground.

4. The magnetic resonance imaging apparatus according to claim wherein an additional phase shift element is arranged in the receive path of the transmit/receive switch, wherein the phase shift element adjusts the phase length of the receive path of the transmit/receive switch, so that a low impedance of the low-noise amplifier is transformed into a high impedance thereby creating additional protection for the low-noise amplifier.

5. The magnetic resonance imaging apparatus according to claim 4, wherein the phase shift element is a coaxial cable.

6. The magnetic resonance imaging apparatus according to claim 1, wherein the coil arrangement comprises
   a) a transmit coil arrangement for transmitting the excitation signal into the subject thereby exciting nuclear spins within the subject, and
   b) a receive coil arrangement for receiving a induced response signal from the subject.

7. The magnetic resonance imaging apparatus according to claim 6, wherein
   a) the transmit coil arrangement is ring-shaped and surrounds the subject of investigation,
   b) the transmit coil arrangement comprises several coil elements, and
   c) the coil elements of the transmit coil arrangement are symmetrically distributed around the circumference of the transmit coil arrangement.

8. The magnetic resonance imaging apparatus according to claim 7, wherein
   a) the coil elements of the transmit coil arrangement are arranged in several adjacent and parallel rows, wherein the rows are arranged one behind the other along a center axis of the transmit coil arrangement,
   b) there is a gap in an axial direction between the adjacent rows of the transmit coil arrangement, and
   c) there is a gap in a circumferential direction between the adjacent coil elements in each row of the transmit coil arrangement.

9. The magnetic resonance imaging apparatus according to claim 8, wherein
   a) the gaps in the transmit coil arrangement are between 10 mm and 14 mm, and
   b) the number of the coil elements of the transmit coil arrangement is at least 8, and
   c) the number of the rows of the transmit coil arrangement is at least two.

10. The magnetic resonance imaging apparatus according to claim 8, wherein
    a) there is an angular offset in a circumferential direction between the coil elements in one of the rows relative to the coil elements in an adjacent one of the rows of the transmit coil arrangement, and
    b) the angular offset between the adjacent rows of the transmit coil arrangement is 180° divided by the number of the coil elements in the individual rows.

11. The magnetic resonance imaging apparatus according to claim 7, wherein
 a) the receive coil arrangement is concave to match an outer convex contour of the subject,
 b) the receive coil arrangement comprises several coil elements, and
 c) the coil elements of the receive coil arrangement are symmetrically distributed around the circumference of the receive coil arrangement.

12. The magnetic resonance imaging apparatus according to claim 11, wherein
 a) the coil elements of the receive coil arrangement are arranged in several adjacent and parallel rows which are arranged one behind the other along a center axis of the receive coil arrangement, and
 b) there is an axial overlap between the adjacent rows, so that the coil elements in one of the rows of the receive coil arrangement and the coil elements in an adjacent one of the rows of the receive coil arrangement geometrically overlap, and
 c) there is a gap in a circumferential direction between the adjacent coil elements in the same row of the receive coil arrangement.

13. The magnetic resonance imaging apparatus according to claim 10, wherein there is an angular offset in a circumferential direction between the coil elements in one of the rows relative to the coil elements in an adjacent one of the rows of the receive coil arrangement.

14. The magnetic resonance imaging apparatus according to claim 13, wherein
 a) the rows of the receive coil arrangement are arranged one above the other with regard to the center axis of the receive coil arrangement, and
 b) the individual coil elements of the lower rows of the receive coil arrangement has an angular offset with respect to the upper row, each geometrically overlap with two coil elements of the adjacent upper row of the receive coil arrangement.

15. The magnetic resonance imaging apparatus according to claim 12, wherein
 a) the gaps in the receive coil arrangement are between 8 mm and 12 mm, and
 b) the number of the coil elements of the receive coil arrangement is at least 31, and
 c) the number of the rows of the receive coil arrangement is at least four, and
 d) the number of the coil elements of the receive coil arrangement is greater than the number of the coil elements of the transmit coil arrangement, and
 e) the receive coil arrangement extends over a length of at least 180 mm along the center axis of the receive coil arrangement, and
 f) the individual coil elements of the receive coil arrangement are smaller than the individual coil elements of the transmit coil arrangement.

16. The magnetic resonance imaging apparatus according to claim 12, wherein the individual coil elements in the top row of the concave receive coil arrangement taper upwards.

17. The magnetic resonance imaging apparatus according to claim 6, wherein individual neighboring coil elements of the transmit coil arrangement are inductively decoupled from each other.

18. The magnetic resonance imaging apparatus according to claim 6, wherein
 a) individual coil elements of the transmit coil arrangement are rectangular loops, and
 b) individual coil elements of the receive coil arrangement are selected from the group consisting of rectangular loops and trapezoid loops.

19. The magnetic resonance imaging apparatus according to claim 7, wherein
 a) the receive coil arrangement is arranged within the transmit coil arrangement, so that the receive coil arrangement is closer to the subject than the transmit coil arrangement, and
 b) the ring-shaped transmit coil arrangement has a larger diameter than the ring-shaped receive coil arrangement, and
 c) the individual coil elements of the receive coil arrangement are smaller than the individual coil elements of the transmit coil arrangement.

20. The magnetic resonance imaging apparatus according to claim 19, wherein the receive coil arrangement and the transmit coil arrangement are aligned coaxially relative to each other.

21. The magnetic resonance imaging apparatus according to claim 19, wherein
 a) the receive coil arrangement and the transmit coil arrangement are aligned parallel to each other, and
 b) the receive coil arrangement is located within the transmit coil arrangement, and
 c) the receive coil arrangement is eccentrically offset to one side relative to the surrounding transmit coil arrangement thereby leaving installation space within the transmit coil arrangement on the opposite side, and
 d) the receive coil arrangement comprises an interruption in its circumference, wherein the interruption provides the installation space.

22. The magnetic resonance imaging apparatus according to claim 21, wherein an optics is arranged in the installation space within the transmit coil arrangement.

23. The magnetic resonance imaging apparatus according to claim 1, wherein at least one of the receive coil arrangement and the transmit coil arrangement comprises a carrier on which the individual coil elements are mounted, wherein the carrier is made of fiber glass or any low loss material.

24. The magnetic resonance imaging apparatus according to claim 1, wherein a frequency of the excitation signal is high enough to excite the nuclear spins within the subject when the subject is exposed to a magnetic-field strength of at least 7 T within the subject.

25. The magnetic resonance imaging apparatus according to claim wherein the diode is a PIN diode.

26. The magnetic resonance imaging apparatus according to claim 4, wherein the phase shift element is a lumped network.

27. The magnetic resonance imaging apparatus according to claim 8, wherein individual neighboring coil elements from the same row of the receive coil arrangement are inductively decoupled from each other.

28. The magnetic resonance imaging apparatus according to claim 22, wherein the optics comprises a fiber optics periscope for visual stimulation of the subject.

* * * * *